United States Patent [19]

Kowalski

[11] Patent Number: 4,881,199

[45] Date of Patent: Nov. 14, 1989

[54] READ CIRCUIT FOR READING THE STATE OF MEMORY CELLS

[75] Inventor: Jacek Kowalski, Trets, France

[73] Assignee: SGS-Thomson Microelectronics S.A., Paris, France

[21] Appl. No.: 143,717

[22] Filed: Jan. 14, 1988

[30] Foreign Application Priority Data

Jan. 16, 1987 [FR] France .................................. 87 00449

[51] Int. Cl.⁴ ........................ G11C 7/00; G11C 11/34; H03K 19/096; H03K 19/017
[52] U.S. Cl. ........................... 365/189.01; 365/189.11; 365/203; 365/185; 365/196; 307/448; 307/481
[58] Field of Search ............... 365/189, 196, 230, 185, 365/189.01, 189.11; 307/448, 473, 449, 463, 530, 481

[56] References Cited

U.S. PATENT DOCUMENTS

| | | | |
|---|---|---|---|
| 4,387,444 | 6/1983 | Edwards | 365/185 |
| 4,443,718 | 4/1984 | Hagiwara et al. | 365/185 |
| 4,475,178 | 10/1984 | Kinoshita | 365/203 |
| 4,649,521 | 3/1987 | Tsuchida et al. | 365/185 |
| 4,680,491 | 7/1987 | Yokouchi et al. | 365/189 |
| 4,710,900 | 12/1987 | Higuchi | 365/189 |

Primary Examiner—Stuart N. Hecker
Assistant Examiner—Melissa J. Koval
Attorney, Agent, or Firm—Oblon, Spivak, McClelland, Maier & Neustadt

[57] ABSTRACT

A read circuit is disclosed for integrated circuits of the logic circuit type, comprising a memory consisting of a matrix of memory cells, the reading of which is done by the detection of a current variation or voltage variation, the memory cells being each addressable by rows and columns selected by row and column decoders, the read circuit being connected to memory cells by a line known as a bit line, and comprising a bit line pre-loading circuit and a detection circuit that detects the conduction or non-conduction of the addressed memory cell. The read circuit comprises a parallel-connected second identical detection circuit, the two detection circuits being connected to a common node of the bit line by means which provide for the simultaneous detection, at each read operation, of a "1" or a "0" regardless of the state of the memory cell addressed, and which provide for obtaining the data read at the output of at least one detection circuit. The invention can be applied to EPROMs in particular.

7 Claims, 2 Drawing Sheets

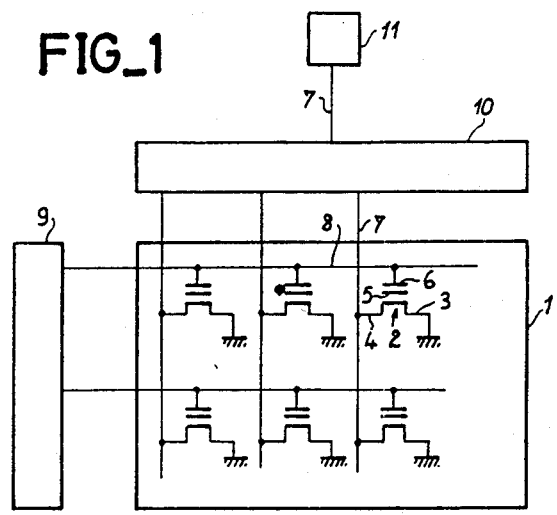
FIG_1
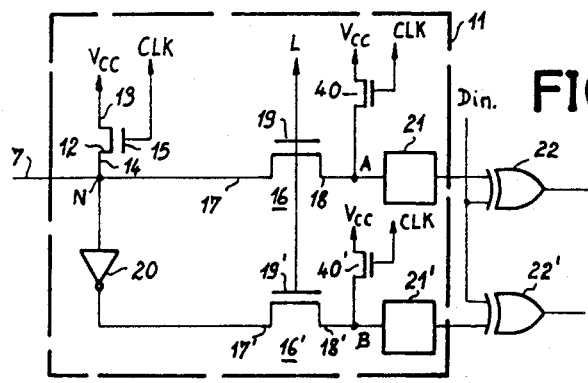
FIG_2A
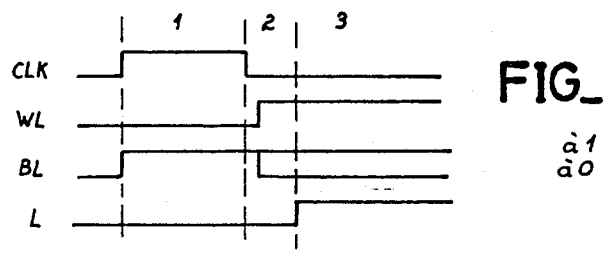
FIG_2B
à 1
à 0

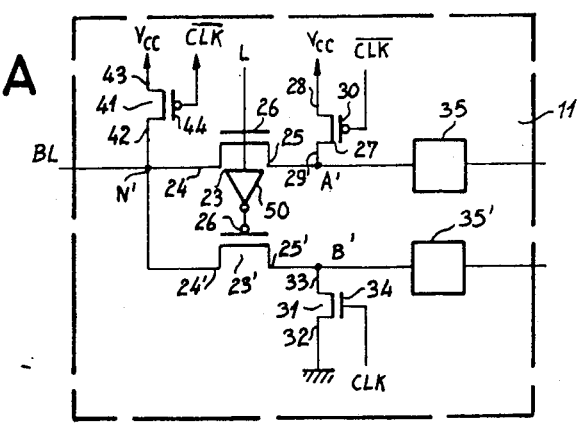
FIG_3A
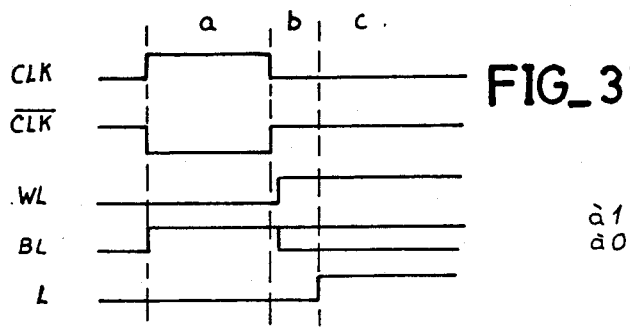
FIG_3B
à 1
à 0
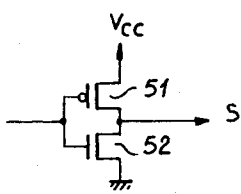
FIG_4A
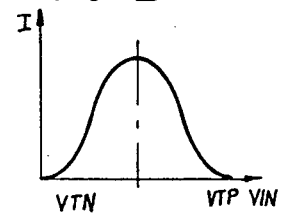
FIG_4B

READ CIRCUIT FOR READING THE STATE OF MEMORY CELLS

BACKGROUND OF THE INVENTION

1. Field of the Invention

The present invention pertains to a read circuit for a memory such as an electrically programmable nonvolatile memory of the EPROM or EEPROM type or any other memory comprising memory cells, the reading of which is done by detecting a current or voltage variation in the bit line.

2. Description of the Prior Art

In the case of EPROM or EEPROM type memories for example, each data storage element or memory cell comprises a floating gate MOS transistor, which may be chiefly of the FAMOS (floating gate avalanche injection MOS) or SAMOS (stacked gate avalanche injection MOS) type. This type of transistor may have two states. Thus, in the case of an N-channel MOS transistor, in a first state no charge or a positive charge is trapped at the floating gate. There may be a conduction channel between the source and the drain. The transistor is then conductive and behaves like a closed switch. In a second state, the electrons are trapped at the floating gate. They therefore prevent the creation of a conduction channel in the substrate between the source and the drain. In this case, the transistor is off and behaves like an open switch.

To program a floating gate MOS transistor, voltages higher than the normal operating voltage should be applied appropriately to the control gate and one of the electrodes so that the floating gate can absorb and keep a charge of electrons. This charge of electrons at the floating gate raises the conduction threshold at the control gate of the transistor. Furthermore, to read a memory thus programmed, a voltage lower than the threshold voltage of the programmed floating gate MOS transistors but greater than the minimum voltage of the non-programmed transistors should be applied to the control gate. This read voltage makes it possible to detect the fact that the transistor is on or off. In general, the floating gate MOS transistor is connected by one of its electrodes o a bit line which is biased by a generator. Its other electrode is connected to the ground or to a low voltage. The bit line is also connected to a current or voltage sensor. This sensor measures the current put through the line by the generator. Thus, if the memory cell has not been programmed, the floating gate MOS transistor is on and, at the application of a read voltage higher than the threshold voltage of the non-programmed transistors, the transistor becomes conductive. A variation in the current or a voltage drop is then detected on the sensor. In the second case, when the memory cell has been programmed, charges are trapped at the floating gate of the transistor. In this case the read voltage applied to the control gate has a direction opposite to the potential barrier created in the conduction channel by the charges stored in the floating gate. However this read voltage is then not enough to modify the conduction of the channel, and the transistor stays off. Consequently, the sensor at the end of the bit line does not perceive the current variation or voltage variation.

Thus, with an EPROM type memory as described above, the content of a memory cell can be read according to the consumption of the circuit, especially when the memory is read bit by bit.

This is especially inconvenient for memories used to receive confidential data because it then becomes easy to detect the content of this data during a read operation.

SUMMARY OF THE INVENTION

It is an aim of the present invention to remove this disadvantage by proposing a read ciruit that always has a current consumption, regardless of whether the memory cell read is in a programmed state or in a non-programmed state.

Consequently, an object of the present invention is a read circuit for integrated circuits of the logic circuit type, comprising a memory made up of a matrix of memory cells, the reading of which is done by the detection of a current or voltage variation, each memory cell being addressable by rows and columns selected by row decoders and column decoders, the read circuit being connected to memory cells by a line called a bit line and comprising a circuit for the pre-loading of the bit line and a detection circuit that detects the conduction or non-conduction of the addressed memory cell, the said read circuit comprising a parallel-connected second identical detection circuit, the two detection circuits being connected to a common node of the bit line by means which provide for the simultaneous detection, at each read operation, of a "1" or a "0" regardless of the state of the memory cell, and which provide for obtaining the data that is read at the output of at least one detection circuit.

Various embodiments can be used for this read circuit.

According to a first embodiment, the read circuit comprises a first bit line pre-loading circuit, a first switching means connected between the first pre-loading circuit and the first detection circuit, a second switching means connected by an inverter between the first pre-loading circuit and the second detection circuit, the switching means being controlled by a read enable signal, and second and third pre-loading circuits performing a pre-loading operation at the same logic level as the first pre-loading circuit, the said second and third pre-loading circuits being connected respectively between each switching means and the corresponding detection circuit.

According to another embodiment, the read circuit comprises a first bit line pre-loading circuit, a first switching means connected between the first pre-loading circuit and the first detection circuit, a second switching means connected between the first pre-loading circuit and the second detection circuit, the switching means being controlled respectively by a read enable signal and by this signal inverted, a second pre-loading circuit, which performs a pre-loading operation at the same logic level as the first pre-loading circuit, being connected between the first switching means and the first detection circuit, and a third pre-loading circuit, which performs a pre-loading operation at the reverse logic level, being connected between the second switching means and the second detection circuit.

BRIEF DESCRIPTION OF THE DRAWINGS

Other characteristics and advantages of the present invention will emerge from the following description of various embodiments, made with reference to the appended drawings, of which:

FIG. 1 is a schematic view of an EPROM memory comprising a read circuit,

FIGS. 2A and 2B are schematic views of a first embodiment of a read circuit according to the present invention as well as a timing diagram of the main signals that control this circuit, FIGS. 3A and 3B are schematic views of another embodiment of a read circuit according to the present invention as well as a timing diagram of the main signals that control this circuit, and, FIGS. 4A and 4B respectively show an embodiment of the detection circuits and the voltage-current curve of this circuit.

To simplify the description, the same references are repeated for the same elements in all the drawings. Furthermore, the description is made with reference to MOS circuits made with CMOS technology, but it is obvious to the specialist that the present invention can be adapted to other technologies, in particular to NMOS technology.

DESCRIPTION OF PREFERRED EMBODIMENTS

FIG. 1 shows an EPROM type electrically programmable non-volatile memory 1. This memory is of the memory cell type consisting of a MOS transistor 2 with a floating gate 5. More specifically, the transistor 2 has two main electrodes, 3 and 4 respectively, a floating gate 5 and a control gate 6. A first main electrode, namely the source in the embodiment shown, is connected to the ground while the other electrode 4, namely the drain, is connected to a line 7 known as a bit line. The control gate 6 is connected to another connection 8 called a word line. The bit lines and word lines are arranged in rows and columns to form a matrix including the memory cells as shown in FIG. 1. This memory comprises means consisting essentially of a row decoder 9 and a column decoder 10 to apply, to the rows and columns, potentials representing data to be recorded in the memory cells or representing commands to read the data recorded in the memory cells. Thus, to read a memory cell, the corresponding word line 8 is raised to a voltage produced by an output of the row decoder 9. By means of the column decoder 10, a control pulse is sent to the corresponding bit line 7. The MOS transistor 2 stays off or comes on depending on whether the charges have previously been trapped or not trapped at its floating gate 5. A read circuit 11, further connected to an end of the bit line 7 by means of the column decode 10, constituting a multiplexer, detects the current variation or the lack of current variation. From this, it deduces that the memory cell is programmed at either "1" or "0" respectively.

Referring to FIG. 2A, we shall now describe a first embodiment of a read circuit according to the present invention. This read circuit 11 comprises firstly a bit line 7 pre-loading circuit. This pre-loading circuit consists of a MOS transistor 12, of the N type in the embodiment shown. This MOS transistor 12 has one of its electrodes 13 connected to the supply voltage $V_{cc}$ and its other main electrode 14 connected to a node N on the bit line 7. Furthermore, the gate 15 of the MOS transistor 2 is connected to the clock CLK of the EPROM memory. Furthermore, the read circuit according to the present invention consists of two parallel arms. The first arm comprises a first switching means consisting of an N type MOS transistor 16. This transistor 16 has one of its main electrodes 17 connected to the node N of the bit line 7 and its other main electrode 18 connected to the input of a first detection circuit 21, the output of which gives the data which is read. The gate 19 of the MOS transistor 16 is connected to a read enable signal L which may be, for example, the read control signal WL applied to the gate of the delayed memory cell.

Furthermore, the second arm of the read circuit essentially consists of a second switching means consisting of a MOS transistor 16' which is identical to the MOS transistor 16. The said MOS transistor 16' has one of its main electrodes 17' connected by means of an inverter 20 to the node N of the bit line 7 and its other electrode 18' connected to the input of a second detection circuit 21' which is identical to the circuit 21. The detection circuits 21 and 21' may consist of two series-connected inverters. The gate 19' of the MOS transistor 16' is connected to the read enable signal L. The second arm simulates an inverted detection of the detection obtained at the first arm so that a "1" and a "0" is detected simultaneously at each read operation, regardless of the state of the addressed memory cell, as shall be explained in greater detail below. Furthermore, there is a second pre-loading circuit connected to the node A between the MOS transistor 16 and the detection circuit 21. This second pre-loading circuit consists of an N type MOS transistor 40 which has one of its electrodes connected to the node A, its other electrode connected to the voltage $V_{cc}$ and its gate connected to the clock signal CLK. This pre-loading circuit performs a pre-loading operation at the same logic level as the first pre-loading circuit consisting of the MOS transistor 12. Furthermore, a third pre-loading circuit is connected to the node B between the MOS transistor 16' and the detection circuit 21. This third pre-loading circuit consists of an N type MOS transistor 40' which has one of its electrodes connected to the node A, its other electrode connected to the voltage $V_{cc}$ and its gate to the clock signal CLK. According to another embodiment, the pre-loading circuts 12, 40, 40' can be made by P type MOS transistors. In this case the gates are connected to a signal $\overline{CLK}$.

According to an embodiment specific to a wired logic memory, the data obtained at the output of the detection circuits 21 and 21' is sent on comparators consisting of exclusive-OR gates 22, 22' which receive an input datum Din to be compared with the datum read, especially in the context of the comparison of a confidential code. The result obtained at the output of the exclusive-OR gate 22 gives the result sought. The exclusive-OR gates may also be replaced by other gates which are turned off by a clock which will be activated at the end of the read operation.

We shall now explain the working of the circuit described above, using the timing diagram of FIG. 2B.

With the above circuit, when the signal CLK is at the logic level "1", i.e. during the period 1 of the diagram, the MOS transistors 12, 40 and 40' are conductive, and the nodes N, A and B are pre-loaded at $V_{cc}-VT$, i.e. at a logic level "1". When the signal CLK goes back to the logic level "0", the control gate 6 of the floating gate MOS transistor 2 is activated by applying the signal WL to it and, depending on the state of the memory cell, the bit line 7 is discharged or not discharged as shown by the signal BL. Thus, if the memory ell formed by the floating gate MOS transistor 2 has not been programmed (i.e. there are no electrons at the floating gate), the transistor is on and, during the application of the read voltage $W_L$ corresponding to the supply voltage, the transistor is made conductive. In this case, the bit line 7 is discharged and the electrode 17 is at a logic level "0" while the electrode 17' is at a logic level "1" because of the inverter 20. When the signal L goes to the logic level "1", as shown by 3 in the diagram of FIG. 2B, the node A is positioned at the logic level "0" causing the detection circuit 21 to change over while the node B stays positioned at the level "1". If, on the contrary, the floating gate transistor has been programmed, the bit line 7 is not discharged. The node N remains at the logic level "1" while the electrode 17' at the output of the inverter 20 is at a logic level "0". When the signal L goes to "1", the node A remains unchanged at "1" while the node B goes to "0". In this case, only the detection circuit 21' changes over. Since the two circuits are identical, their consumption is identical for the reading of "0" or a "1".

Referring to FIG. 3A, we shall now describe another embodiment of a read circuit according to the present invention. This read circuit has a first pre-loading circuit consisting of a P type MOS transistor 41 which has one of its electrodes 42 connected to the node N' of the bit line 7, its second electrode connected to the voltage $V_{cc}$ and its gate connected to the inverted clock signal $\overline{CLK}$. Furthermore, the read circuit has a first arm with a first switching means consisting of an N type MOS transistor 23 which has one of its main electrodes 24 connected at the node N' to the bit line 7 and its other main electrode 25 connected to a first detection circuit 35. The gate 26 of the MOS transistor 23 is connected to a read enable circuit L. A pre-loading circuit is connected to the node A' at the output of the MOS transistor 23. More specifically, in the embodiment shown, this pre-loading circuit consists of a P type MOS transistor 27 which has one of its main electrodes 28 connected to the supply voltage $V_{cc}$ and its other electrode 29 connected to the node A' between the electrode 25 of the MOS transistor 23 and the circuit 35. The gate 30 of the MOS transistor 27 is connected to the inverted clock signal $\overline{CLK}$. Furthermore, the read circuit 11 has a second arm with a second switching means consistig of a P type MOS transistor 23' which has one of its main electrodes 24' connected at the node N' to the bit line 7 and its other main electrode 25' connected to a second detection circuit 35'. The gate 26' of the MOS transistor 23' is connected by means of an inverter 50 to the read enable signal L. Furthermore, a pre-loading circuit is connected to the node B' between the electrode 25' and the circuit 35'. This pre-loading circuit consists of an N type MOS transistor 31 which has one of its main electrodes 32 connected to the ground $V_{ss}$ while its other main electrode 33 is connected to the node B'. The gate 34 of the MOS transistor 31 is connected to the clock signal CLK.

The working of this read circuit is explained below with reference to the timing diagram of FIG. 3B.

During the period a, the clock signals CLK and $\overline{CLK}$ are respectively at the logic levels "1" and "0". Consequently, the nodes N' and A' are pre-loaded at the supply voltage $V_{cc}$ while the node B' is pre-loaded at the ground $V_{ss}$.

During the period b, the read command WL, applied to the gate of the floating gate MOS transistor forming the memory cell, goes to "1". During this period, the content of the memory cell is read. The node N' either remains at $V_{cc}$ or is discharged at $V_{ss}$ according to the content of the memory cell as represented by the signal BL.

During the period c, the read enable signal L is positioned at "1". If the node N' has not been discharged, the node A' remains positioned at the voltage $V_{cc}$ while the node B' changes over to the voltage $V_{cc}$. If, on the contrary, the node N' has been discharged, the node A' changes over to the ground $V_{ss}$ while the node V' remains positioned at the ground $V_{ss}$.

In this embodiment, the detection circuits 35, 35' are made up of CMOS technology inverters of the type shown in FIG. 4A.

This inverter consists, in a known way, of a P type MOS transistor 51 which has one of its electrodes connected to $V_{cc}$ and its other electrode connected to one of the electrodes of an N type MOS transistor 52. The other electrode of this MOS transistor 52 is connected to the ground $V_{ss}$. The two gates are connected together and to the input voltage $V_{IN}$ and the output S is obtained at the node between the two transistors.

The consumption curve of a CMOS inverter is shown in FIG. 4B. This curve shows that the consumption is the same when $V_{IN}$ goes from $V_{cc}$ to $V_{ss}$ or when $V_{IN}$ goes from $V_{ss}$ to $V_{cc}$. This property is used in the circuit of FIG. 3A to obtain the desired result, namely a current consumption which is identical regardless of the state of a memory cell.

The embodiments described above have been as examples. It is obvious to the specialist that they can be modified, especially as regards the type of MOS transistors used for the pre-loading circuits or the switching circuits.

Furthermore, the present invention has been described with reference to an EPROM and it is obvious that it can be applied to an EEPROM or to any memory in which the memory cells are read by detecting a current variation or voltage variation on the bit line.

What is claimed is:

1. A read circuit for an array of addressable memory cells, wherein said cells have two possible complementary logic states and the state of an addressed cell is readable by detecting a current variation on a bit line to which said cell is connected during a read operation, said read circuit comprising a first precharge circuit for precharging said bit line to a first specified voltage level prior to a read operation, and a first detection circuit having an input connected during a read operation, and a first detection circuit having an input connected during a read operation to said precharged bit line, for detecting a current variation on said bit line, said current variation depending on the state of the addressed cell, said read circuit further comprising:
   an isolation switch between said bit line and the input of said first detection circuit, said isolation switch rendered conductive only during a read operation;
   a second detection circuit identical to said first mentioned detection circuit and having an input connected to said bit line through at least a second isolation switch, said second switch also rendered conductive only during a read operation,
   a second precharge circuit connected to the input of said first mentioned detection circuit for precharging to a second specified voltage the input of said first detection circuit prior to a read operation,
   a third precharge circuit connected to the input of said second detection circuit, for precharging to a third specified voltage the input of said second detection circuit prior to a read operation;
   said specified voltages being such that whatever the state of the addressed cell, one of the two detection circuits will detect a current variation corresponding to the actual state of the addressed cell and the other detection circuit will detect a current variation corresponding to a state which is complementary of this actual state.

2. A read circuit according to claim 1, wherein said second isolation switch is connected to the bit line through an inverter and said first, second, and third specified precharge voltages are equal to a common high logic level voltage.

3. A read circuit according to claim 2, wherein said first and second switch means are MOS transistors.

4. A read circuit according to claim 2, wherein said precharge circuits each comprises a MOS transistor connected to a supply voltage.

5. A read circuit according to claim 1, wherein said second isolation switch is directly connected to said bit line, said first and second specified precharge voltages are equal to a common high logic level voltage and said third specified voltage level is a low logic level voltage.

6. A read circuit according to claim 5, wherein said first and second precharge circuits each comprises a MOS transistor connected to a supply voltage, and said third precharge circuit comprises a transistor connected to a ground voltage.

7. A read circuit according to claim 6, wherein said first isolation switch comprises a NMOS transistor and said second isolation switch comprises a PMOS transistor.

* * * * *